United States Patent
Lepper et al.

(10) Patent No.: US 12,024,049 B2
(45) Date of Patent: Jul. 2, 2024

(54) ELECTRIC METER AND CORRESPONDING OPERATING METHOD

(71) Applicant: Isabellenhuette Heusler GmbH & Co. KG, Dillenburg (DE)

(72) Inventors: Andreas Lepper, Hohenahr (DE); Michael Pollmann, Dillenburg (DE)

(73) Assignee: ISABELLENHUETTE HEUSLER GMBH & CO. KG, Dillenburg (DE)

( * ) Notice: Subject to any disclaimer, the term of this patent is extended or adjusted under 35 U.S.C. 154(b) by 670 days.

(21) Appl. No.: 17/284,960

(22) PCT Filed: Oct. 15, 2019

(86) PCT No.: PCT/EP2019/077867
§ 371 (c)(1),
(2) Date: Apr. 13, 2021

(87) PCT Pub. No.: WO2020/078950
PCT Pub. Date: Apr. 23, 2020

(65) Prior Publication Data
US 2021/0354585 A1 Nov. 18, 2021

(30) Foreign Application Priority Data
Oct. 16, 2018 (DE) .......................... 102018125597.7

(51) Int. Cl.
*B60L 53/16* (2019.01)
*B60L 53/66* (2019.01)
(Continued)

(52) U.S. Cl.
CPC ............ *B60L 53/665* (2019.02); *G01R 22/10* (2013.01); *B60L 53/16* (2019.02); *B60L 53/18* (2019.02)

(58) Field of Classification Search
USPC .......................... 320/106, 107, 108, 109, 110
See application file for complete search history.

(56) References Cited

U.S. PATENT DOCUMENTS 8,860,368 B2 10/2014 Ohtomo
9,114,721 B2 8/2015 Tsuda
(Continued)

FOREIGN PATENT DOCUMENTS

CN 106253974 A * 12/2016 ........ G01M 11/3136
CN 106546944 A * 3/2017
(Continued)

OTHER PUBLICATIONS

English Abstract of DE102014226397.
International Search Report for corresponding PCT Application No. PCT/EP2019/077867 dated Jan. 30, 2020.

*Primary Examiner* — Brian Ngo
(74) *Attorney, Agent, or Firm* — Caesar Rivise, PC (57) ABSTRACT

The invention relates to an electric meter (1) for measuring the electricity consumption of a load ($R_{LOAD}$), in particular during a charging process of an electric car. The electric meter (1) according to the invention contains a current output (5, 6), in particular with two current connections (5, 6), for connecting a connecting cable (7) leading to a transfer point (9, 10), in particular in a plug (8) of the connecting cable (7), whereby the load ($R_{LOAD}$) is supplied with an electric current ($I_{LOAD}$) via the connecting cable (7) at the transfer point (9, 10). Furthermore, the electric meter (1) according to the invention contains a measuring circuit (11, 12) for measuring at least one electrical consumption variable of the current ($I_{LOAD}$) flowing via the current output (5, 6) to the load ($R_{LOAD}$). The invention provides that the electric meter (1) can optionally be operated in one of several operating modes, whereby the operating modes differ in the consideration of line losses in the connecting cable (7). Furthermore, the invention comprises an associated operating method.

17 Claims, 4 Drawing Sheets

(51) Int. Cl.
*G01R 22/10* (2006.01)
*B60L 53/18* (2019.01)

(56) References Cited

U.S. PATENT DOCUMENTS

| | | |
|---|---|---|
| 9,665,917 B2 | 5/2017 | Tsuda |
| 10,084,266 B1 | 9/2018 | Tsao et al. |
| 10,189,360 B2 | 1/2019 | Ohtomo |
| 2012/0112735 A1 | 5/2012 | Tokunga |
| 2012/0253715 A1 | 10/2012 | Ohtomo |
| 2013/0067253 A1 | 3/2013 | Tsuda |
| 2013/0127414 A1 | 5/2013 | Ohtomo |
| 2013/0300429 A1 | 11/2013 | Jefferies et al. |
| 2015/0115874 A1 | 4/2015 | Magnusson et al. |
| 2015/0317755 A1 | 11/2015 | Tsuda |

FOREIGN PATENT DOCUMENTS

| | | |
|---|---|---|
| DE | 102012102633 | 10/2012 |
| DE | 102012110525 | 5/2015 |
| DE | 102014226397 | 6/2016 |
| EP | 2579417 | 4/2013 |

\* cited by examiner

ELECTRIC METER AND CORRESPONDING OPERATING METHOD

CROSS-REFERENCE TO RELATED APPLICATIONS

This application is a U.S. National Phase Application under 35 U.S.C. § 371 of PCT/EP2019/077867, filed Oct. 15, 2019, which claims priority to German Patent Application No. 102018125597.7, filed Oct. 16, 2018, the contents of which are incorporated herein by reference in their entirety.

The invention relates to an electric meter for measuring the electrical consumption of an electrical load, for example during a charging process of an electric car. Furthermore, the invention comprises a corresponding operating method.

BACKGROUND OF THE INVENTION

Figure 1:
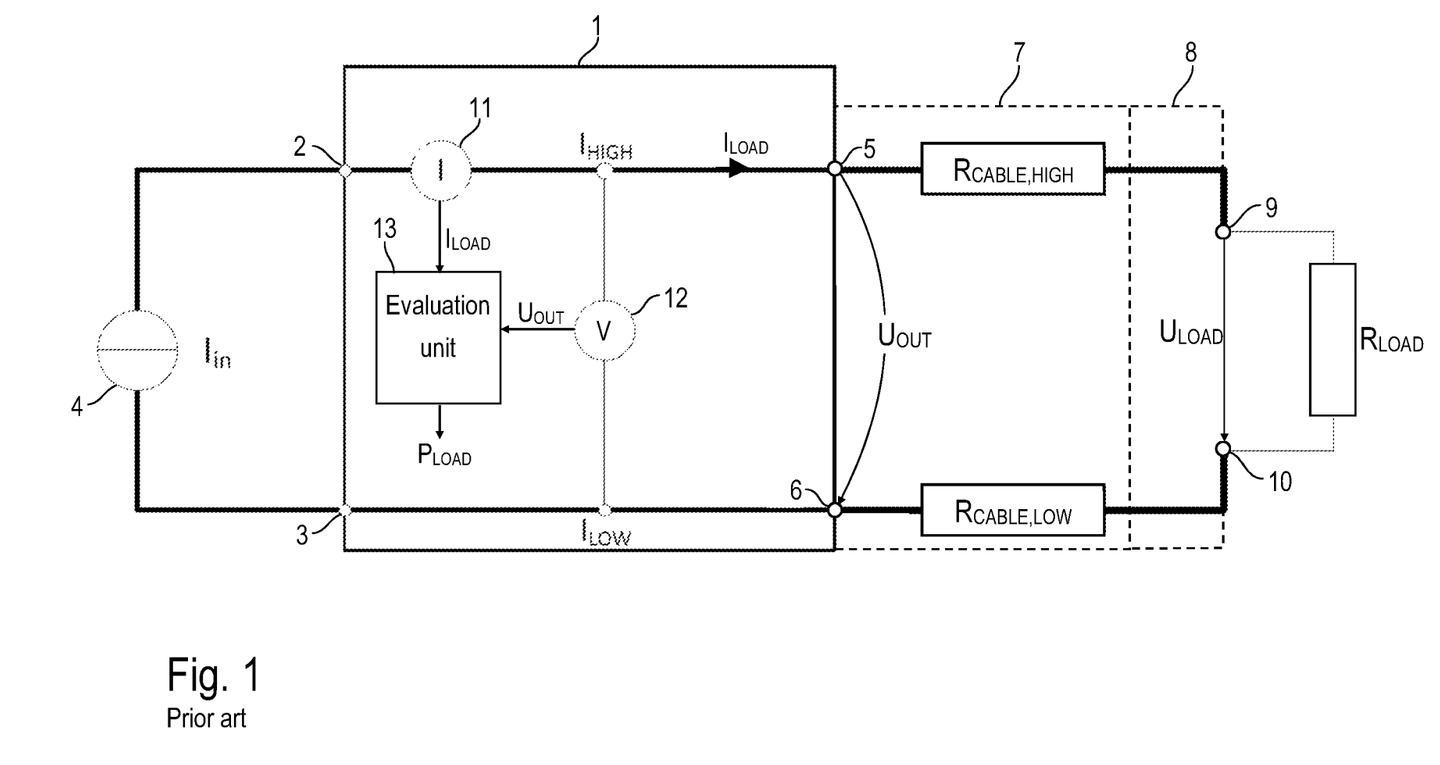
FIG. 1 a schematic representation of a conventional electric meter system.

Electric meters are known from the state of the art which are used, for example, during a charging process of an electric car in order to measure the electrical power taken during a charging process, which is necessary for consumption billing. FIG. 1 shows a schematic representation of such a known electric meter 1, which is connected on the input side via a high-side current connection 2 and a low-side current connection 3 to a charging source 4, which is only shown schematically here. On the output side, the electric meter also has a high-side current connection 5 and a low-side current connection 6, whereby the high-side current connection 5 and the low-side current connection 6 are connected via a charging cable 7 with a plug 8 to an electrical load $R_{LOAD}$. The plug 8 has two connections 9, 10, which define a transfer point to the $R_{LOAD}$ load. The charging cable 7 has a charging line $R_{CABLE,HIGH}$ on the high side and a charging line $R_{CABLE,LOW}$ on the low side. During a charging process, a charging current $I_{LOAD}$ flows through the charging cable 7 to the load $R_{LOAD}$, for example to charge a rechargeable battery in an electric car. The charging current $I_{LOAD}$ is measured in the electric meter 1 by a current measuring device 11, whereby the current measuring device 11 can measure the charging current $I_{LOAD}$, for example, by means of a low ohmic current measuring resistance ("shunt"). Furthermore, the electric meter 1 includes a voltage measuring device 12, which measures an output voltage $U_{OUT}$ between high-side and low-side within the electric meter 1. An evaluation unit 13 then calculates the charge power $P_{LOAD}$ from the measured charge current $I_{LOAD}$ and the measured output voltage $U_{OUT}$.

The problem with this well-known measuring principle is that the line losses in the charging cable 7 are not directly taken into account, so that the actual charging power $P_{LOAD}$ at the transfer point formed by the two connections 9, 10 of the plug 8 is smaller than the charging power $P_{LOAD}$ calculated by the evaluation unit 13.

Theoretically there is the possibility of a calculated compensatory consideration of the line losses in the charging lines $R_{CABLE,HIGH}$, $R_{CABLE,LOW}$. However, this presupposes that the essential line parameters (e.g. line length, line cross section, specific electrical conductivity of the line material) are known, which is not always the case. This mathematical consideration of the line losses by a parameterized measured value compensation is therefore only possible in certain cases.

Furthermore, it is conceivable to take into account the line losses by a four-wire measurement by measuring the charging voltage directly at the transfer point in the connector. However, this requires the presence of appropriate measuring lines which enable a voltage measurement at the transfer point. However, this is often not the case when retrofitting existing systems.

The invention is therefore based on the task of creating a correspondingly improved electric meter.

SUMMARY

This task is solved by an electric meter or a corresponding operating method according to the independent claims.

The electric meter in accordance with the invention firstly has a current output in accordance with the known electric meter described at the beginning, in particular with two current connections on the high side and on the low side, in order to connect a connecting cable leading to a transfer point, in particular in a plug of the connecting cable, whereby the load is supplied with an electric current via the connecting cable at the transfer point.

Preferably, the connecting cable is a charging cable, whereby the plug of the charging cable can be connected to an electric car, for example, to charge the electric car. Alternatively, the electric car itself may have a charging cable with a plug that is then connected to the power output of the electric meter.

Further, the electric meter according to the invention in agreement with the well-known electric meter described at the beginning comprises a measuring circuit, in order to measure at least one electrical consumption variable of the current flowing over the current output to the load.

The electric meter according to the invention is now characterized by the fact that it can be optionally operated in one of several operating modes, whereby the operating modes differ by the consideration of the line losses in the connecting cable. The electric meter can then preferably select the suitable operating mode independently, preferably depending on whether a four-wire measurement is possible and whether line data of the connecting cable are stored, which enable a parameterized measured value compensation of the line losses.

In the preferred embodiment of the invention, the electric meter initially exhibits a first operating mode in which the electric meter takes into account the line losses in the connecting cable to the load by means of a four-wire measurement directly at the transfer point to the load, namely on the one hand by means of a voltage measurement at the transfer point and on the other hand by means of a current measurement in the electric meter.

For this purpose, the measuring circuit in the electric meter preferably first has a first voltage measurement input in order to measure a first voltage directly at the transfer point to the load against a reference potential. The reference potential is preferably the potential of the high-side in the electric meter. The measurement of this first voltage is preferably done via a measuring line in the connecting cable, the measuring line being connected to the first voltage measurement input of the measuring circuit on the one hand and to the transfer point on the other hand to measure the voltage at the transfer point. Preferably, this first voltage is measured at the high-side at the transfer point.

In addition, the measuring circuit preferably has a second voltage measurement input to measure a second voltage directly at the transfer point to the load, preferably at the low side. The second voltage is preferably measured against the same reference potential, i.e. preferably against the potential of the high-side in the electric meter. The measurement of the second voltage is also preferably done through a measuring line running in the connecting cable and from the second voltage measurement input to the measuring point at the transfer point, preferably at the low side of the transfer point.

Furthermore, the measuring circuit preferably has a third voltage measurement input to measure a third voltage in the electric meter, preferably between the high-side and the low-side in the electric meter.

In addition, in accordance with the state of the art, the electric meter of the invention preferably has a current measuring device to measure the output current flowing to the load. This current measuring device can, for example, operate according to the four-wire technique and have a low-resistance current measuring resistor ("shunt"), as is sufficiently known from the state of the art and therefore does not need to be further described. However, the current measuring device can also use other measuring principles to measure the output current.

In addition, the electric meter in accordance with the invention has a calculation unit which calculates the line losses in the connecting cable in the first operating mode according to the four-wire technique, depending on the following measured variables:

measured value of the first voltage,
measured value of the second voltage,
measured value of the third voltage, and
measured value of the output current.
This calculation can be done with the following formula:

$$P_{LOSS}=I_{LOAD}\cdot(U3-U2+U1).$$

with:
$I_{LOAD}$: Output current through the connection cable,
U1: Voltage at the transfer point on the high side,
U2: Voltage at the transfer point on the low side,
U3: Voltage in the electric meter between high-side and low-side.

In addition, the electric meter according to the invention can preferably also be operated in a second operating mode in which the line losses are not taken into account according to the four-wire technique, as described above. Instead, the line losses in the connecting line are taken into account in the second operating mode by a parameterized calculation of the line losses. This requires that the relevant line parameters (e.g. length of the connecting cable, specific electrical conductivity of the connecting cable material, line cross-section of the connecting cable) are stored in a parameter memory of the electric meter. The calculation unit in the electric meter can then calculate the line resistance and/or the line losses in the connecting cable depending on the measured current on the one hand and the stored line parameters on the other hand. This calculation of the power loss in the connecting cable can be done according to the following formula:

$$P_{LOSS}=I_{LOAD}^2\cdot 2\cdot L/(\sigma\cdot A).$$

with:
$I_{LOAD}$: output current through the connection cable,
L: single length of the connection cable,
A: wire cross section of the connection cable,
σ: specific electrical conductivity of the conductor material of the connecting cable.

However, the two operating modes described above are not possible if no line parameters are stored in the parameter memory and if no four-wire measurement is possible according to the first operating mode. The electric meter can therefore preferably also be operated in a third operating mode in which the line losses in the connecting cable to the load are not taken into account at all.

The three operating modes described above are prioritized in the sense that the first operating mode is preferably selected if a four-wire measurement at the transfer point is possible. Alternatively, the second operating mode is selected if line parameters are stored in the parameter memory. The third operating mode is then only selected if neither a four-wire measurement is possible nor line parameters are stored in the parameter memory.

The operating mode is preferably selected by a selection device in the electric meter. The selection device determines whether measuring lines are connected to the voltage measurement inputs of the electric meter and, if so, selects the first operating mode. Furthermore, the selection device preferably determines whether line parameters are stored in the parameter memory and selects the second operating mode if no measuring lines are connected to the voltage measurement inputs, so that a four-wire measurement is not possible, provided, however, that line parameters are stored in the parameter memory, which enables a parameterized measured value compensation of the power losses. In contrast, the selection device selects the third operating mode if neither a four-wire measurement is possible nor line parameters are stored in the parameter memory.

In the preferred embodiment of the invention, the selection device compares the output voltage measured inside the electric meter at the current output with the output voltage measured directly at the transfer point. The selection device then selects the first operating mode with the four-wire measurement if the difference between the two output voltages is within a given tolerance range, since this indicates that measuring lines for a four-wire measurement are connected. If, on the other hand, no measuring lines for four-wire measurement are connected, no voltage is measured at the voltage measurement inputs of the electric meter either, so that the difference between the two output voltages is relatively large, indicating that four-wire measurement is not possible.

In addition, the selection device checks whether line parameters are stored in the parameter memory. If the difference between the two output voltages does not lie within the specified tolerance range and thus a four-wire measurement is not possible, the selection device selects the second operating mode with the parameterized calculation of the line losses and if line parameters are stored in the parameter memory.

Otherwise, the selection device selects the third operating mode, in which the line losses are not considered at all. This selection of the third operating mode is made if the difference between the two output voltages is not within the specified tolerance range and if no line parameters are stored in the parameter memory.

It should also be mentioned that the invention does not only claim protection for a electric meter as a single component. Rather, the invention also claims protection for an electric meter system comprising the electric meter according to the invention and a connecting cable, the connecting cable containing the two measuring lines which enable the voltage to be measured directly at the transfer point.

Finally, the invention also comprises a corresponding operating method for an electric meter, whereby the individual process steps of the operating method according to the invention result from the above description of the operating mode of the electric meter according to the invention and therefore need not be described separately.

Other advantageous further developments of the invention are characterized in the dependent claims or are explained in more detail below together with the description of the preferred embodiment of the invention using the figures. The show:

DETAILED DESCRIPTION

Figure 2:
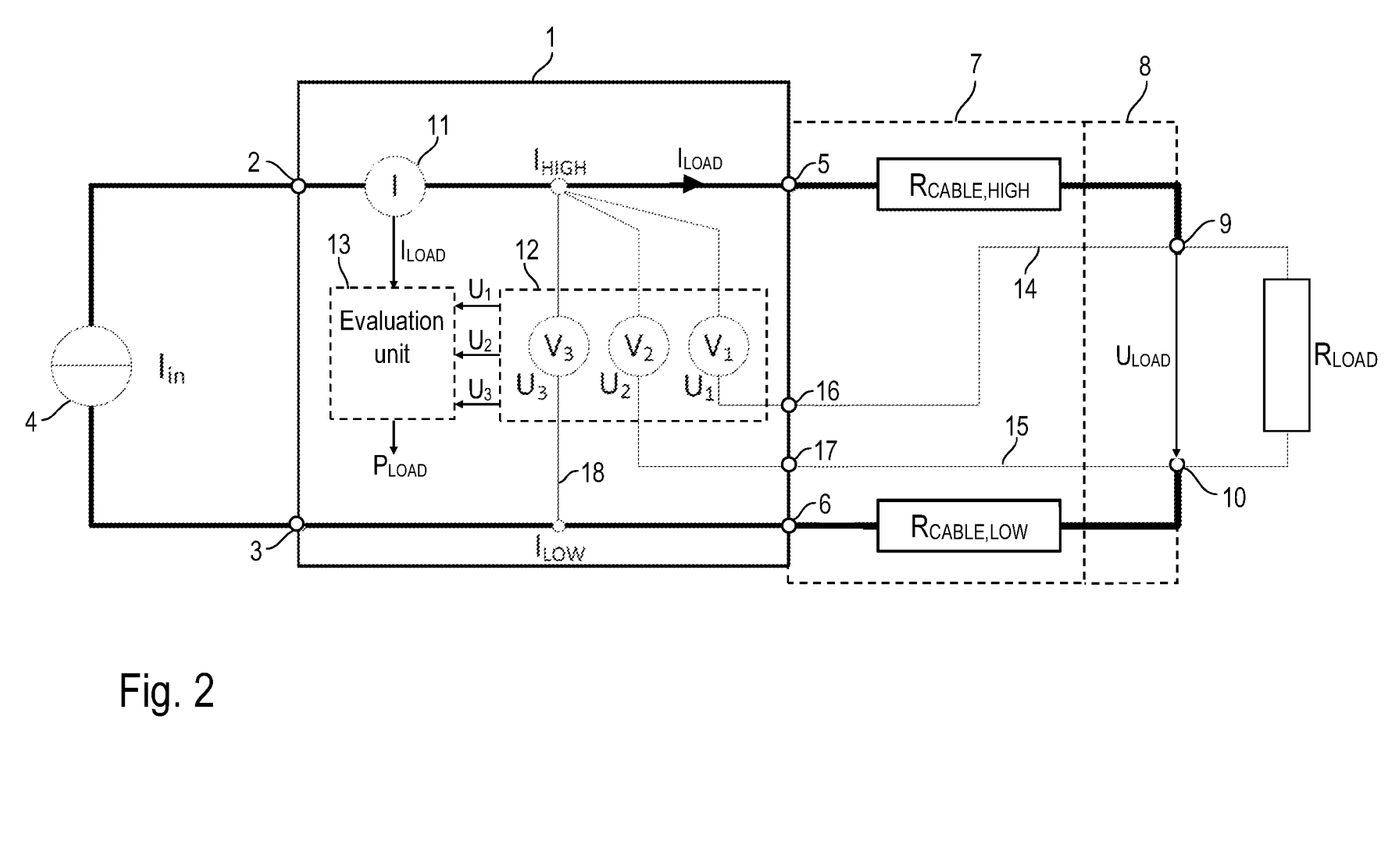
FIG. 2 a schematic representation of an electric meter system according to the invention, FIG. 3 a schematic representation of the evaluation unit in the electric meter according to the invention according to FIG. 2, as well as FIG. 4 is a flowchart to illustrate the operating procedure of the electric meter of the invention.

In the following, the embodiment according to FIG. 2 is described, which partly corresponds to the conventional system described at the beginning and shown in FIG. 1, so that in order to avoid repetition, reference is made to the above description, whereby the same reference signs are used for corresponding details.

A special feature is that two measuring lines 14, 15 run through the charging cable 7, enabling voltage measurement directly at the transfer point formed by the two connections 9, 10 of the plug 8. The measuring line 14 enables a voltage measurement at the high-side at the connection 9 of the plug 8, while the other measuring line 15 enables a voltage measurement at the connection 10 of the plug 8 at the low-side.

Alternatively, however, it is also possible for the measuring lines 14, 15 to run outside the charging cable 7, for example in a separate measuring line.

In addition, there is the possibility that the measuring lines 14, 15 are not connected at all, as may be the case, for example, when retrofitting existing systems. In this case, no four-wire measurement is possible at the transfer point, so that the line losses cannot be compensated for metrologically in accordance with the four-wire technique. Instead, the line losses are then taken into account by a parameterized measured value compensation, as described in detail below.

For interrogation of the two measuring lines 14, 15 in the first operating mode with consideration of the line losses according to the four-wire technique, the electric meter 1 has two voltage measuring connections 16, 17.

The voltage measuring device 12 contains two voltmeters V1, V2, where the voltmeter V1 measures a voltage U1 at the high-side connector 8 at terminal 9 with respect to a reference potential formed by the high-side at terminal 5.

In addition, the voltage measuring device 12 has a voltmeter V2 which measures a voltage U2 on the other terminal 10 of connector 8 on the low side, also with respect to the reference potential on power terminal 5 on the high side of meter 1.

Furthermore, the voltage measuring device 12 has a third voltmeter V3 which measures a voltage U3 between high-side and low-side in the electric meter 1 via a measuring line 18.

Figure 3:
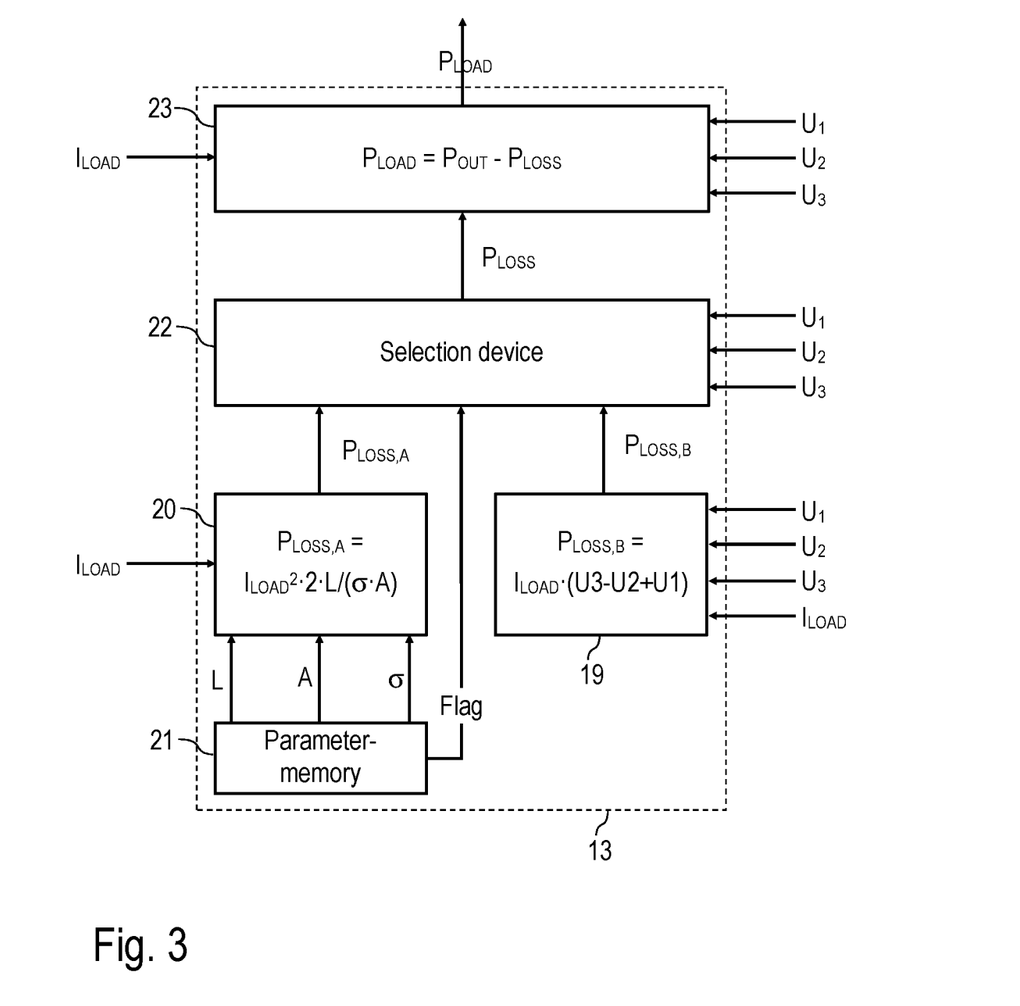

The three voltages U1, U2, U3 are transmitted to the evaluation unit 13, which is shown schematically in FIG. 3.

On the one hand, a calculation unit 19 in the evaluation unit 13 calculates the line losses $P_{LOSS,B}$ in the charging cable 7 according to the four-wire technique using the following formula:

$$P_{LOSS,B} = I_{LOAD} \cdot (U3 - U2 + U1),$$

with:

$I_{LOAD}$: Output current through the charging cable 7,
U1: voltage at the transfer point on the high side, i.e. at connection 9,
U2: voltage at the transfer point on the low side, i.e. at terminal 10,
U3: voltage in electric meter 1 between high-side and low-side.

On the other hand, a calculation unit 20 in the evaluation unit 13 calculates the line loss $P_{LOSS,A}$ in the charging cable 7 depending on stored line parameters according to the following formula:

$$P_{LOSS,B} = I_{LOAD}^2 \cdot 2 \cdot L / (\sigma \cdot A),$$

with:

$I_{LOAD}$: Output current through the charging cable 7,
L: single length of the charging cable 7,
A: wire cross section of the charging cable 7,
σ: specific electrical conductivity of the conductor material of the charging cable 7.

The calculation unit 20 gets the line parameters from a parameter memory 21, in which the line parameters are stored. The parameter memory 21 transmits a flag to a selection device 22, which indicates whether the line parameters are stored in the parameter memory 21. Selection device 22 thus knows whether line parameters are stored in parameter memory 21, which is necessary for parameterized measured value compensation of line losses.

In addition, the selection device 22 compares the output voltage $U_{OUT}$ at the output of the electric meter 1 with the charging voltage $U_{LOAD}$ at the transfer point, which is measured according to the four-wire technique. If both voltages are within a given tolerance range, the selection device 22 knows that the line losses can be taken into account according to the four-wire technique. The selection device 22 then selects the first operating mode in which the line losses according to the four-wire technique are taken into account. The selection device 22 can then take over the line losses $P_{LOSS,B}$ which were calculated by the calculation unit 19.

If the difference between the two voltages $U_{OUT}$ and $U_{LOAD}$ is not within the specified tolerance range, the selection device 22 knows that no four-wire measurement is possible at the transfer point.

In this case, the selection device 22 further checks whether a flag is sent from the parameter memory 21 indicating that line parameters are stored in parameter memory 21. If this is the case, the selection device 22 selects the second operating mode in which the line losses in charging cable 7 are taken into account by a parameterized measurement compensation. The selection device 22 then selects the power loss $P_{LOSS,A}$, which was calculated by the calculation unit 20.

If, on the other hand, the selection device 22 does not receive a flag from the parameter memory 21 because no line parameters are stored in the parameter memory 21, the selection device 22 selects the third operating mode in which the line losses $P_{LOSS}$ are assumed to be zero.

A calculation unit 23 then calculates the output power $P_{LOAD}$ at the transfer point between the two connections 9, 10 depending on the output power $P_{OUT}$ at the output of the electric meter 1 and the power loss $P_{LOSS}$.

Figure 4:
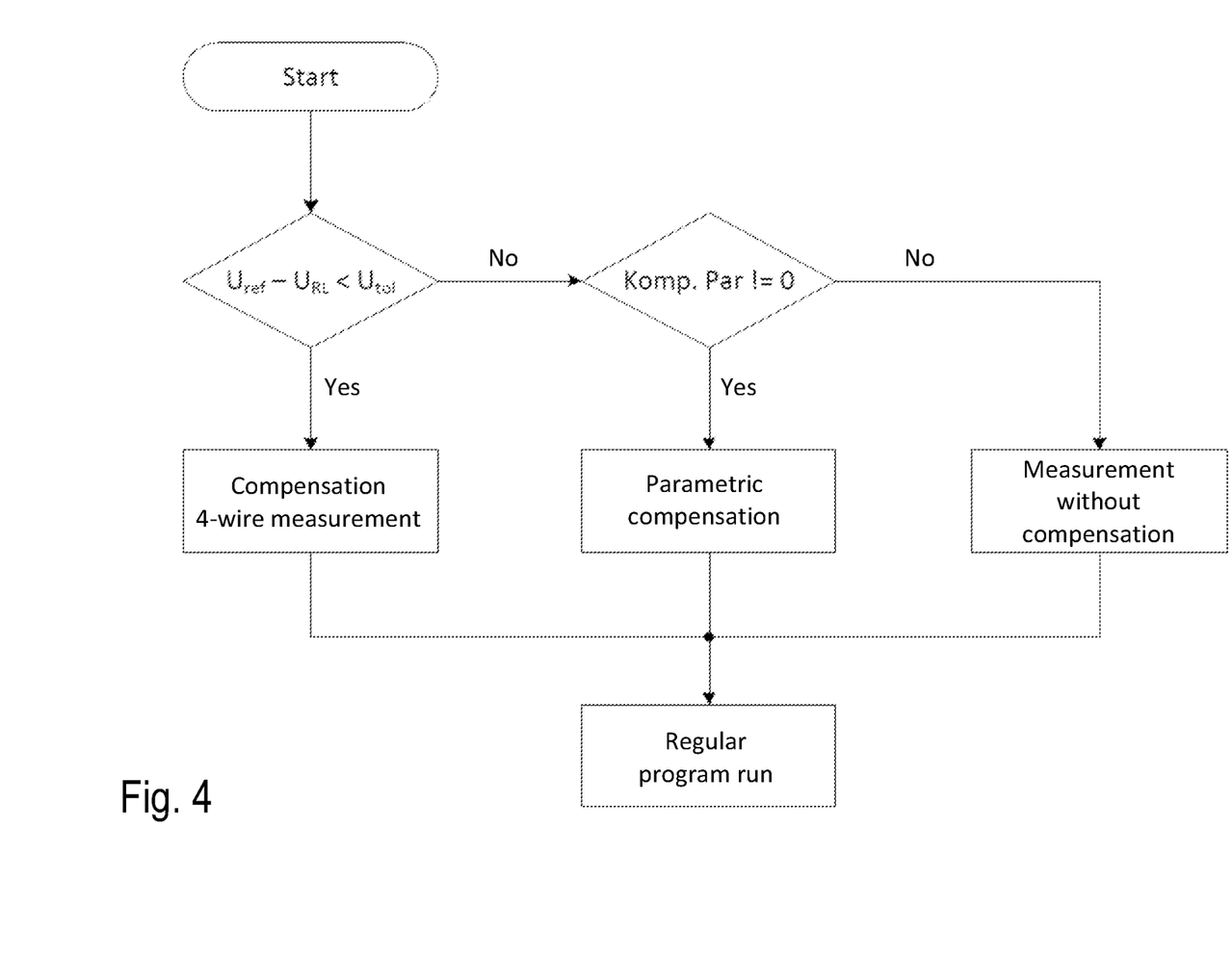

FIG. 4 shows the operating mode of the meter in the form of a flow diagram.

In a first step S1, a check is first made whether the difference between the output voltage $U_{OUT}$ at the output of the electric meter 1 and the charging voltage $U_{LOAD}$ at the transfer point between the two terminals 9, 10 is within a specified tolerance range $U_{TOL}$. If this is the case, the line losses are taken into account in a step S2 according to the four-wire measurement as described above.

If the difference between the output voltage $U_{OUT}$ and the charging voltage $U_{LOAD}$ is not within the tolerance range $U_{TOL}$, a check is made in a step S3 to see whether a parameterized measured value compensation of the line losses is possible, which requires a storage of the line parameters (e.g. cable length, cable cross section, specific electrical conductivity of the line material).

If necessary, a parametric measured value compensation of the line losses is then carried out in a step S4.

Otherwise, in a step S6 no consideration of the line losses is done.

In a step S7 a regular program run is performed.

The invention is not limited to the preferred embodiment described above. Rather, a large number of variants and modifications are possible, which also make use of the inventive idea and therefore fall within the scope of protection. In particular, the invention also claims protection for the subject matter and the features of the dependent claims independently of the claims referred to in each case, and in particular also without the features of the main claim or the independent claims.

LIST OF REFERENCES SIGNS

1 Electric meter
2 Input-side high-side power connection
3 Input-side low-side power connection
4 Charging source
5 Output-side high-side power connection
6 Output-side low-side power connection
7 Charging cable
8 Plugs
9, 10 Connections of the plug
11 Current measuring device
12 Voltage measuring device
13 Evaluation unit
14, 15 Measuring lines in the charging cable
16, 17 Voltage measuring connections
18 Measuring line in the electric meter
19 Calculation unit
20 Calculation unit
21 Parameter memory
22 Selection device
23 Calculation unit
$I_{LOAD}$ Charging current
$I_{in}$ Input current from the charging source
$P_{LOAD}$ Charge power
$R_{CABLE,HIGH}$ Line resistance in the charging cable on the high-side
$R_{CABLE,LOW}$ Line resistance in the charging cable on the low side
$R_{LOAD}$ Load
U1, U2, U3 Measured voltage values
$U_{LOAD}$ Charge voltage at the transfer point
$U_{OUT}$ Output voltage at the electric meter before the charging cable
V1, V2, V3 Voltmeter

The invention claimed is:

1. Electric meter for measuring the electricity consumption of a load, comprising:
a) a current output for the connection of a connecting cable leading to a transfer point, the load being supplied with an electric current via the connecting cable at the transfer point,
b) a measuring circuit for measuring at least one electrical consumption variable of the current flowing via the current output to the load,
c) the electric meter being operational in one of several operating modes, the operating modes differing by taking into account line losses in the connecting cable; and
d) a first operating mode in which the electric meter takes into account the line losses in the connecting cable to the load by a four-wire measurement directly at the transfer point to the load, namely on the one hand a voltage measurement at the transfer point and on the other hand a current measurement in the electric meter.

2. Electric meter according to claim 1, wherein
a) the current output has two current connections, and
b) the transfer point is in a plug of the connecting cable.

3. Electric meter according to claim 1, wherein
a) the measuring circuit has a first voltage measurement input for measuring a first voltage directly at the transfer point to the load with respect to a reference potential, with the first voltage measurement input being connected to the transfer point via a first measuring line in the connecting cable,
b) the measuring circuit has a second voltage measurement input for measuring a second voltage directly at the transfer point to the load with respect to the reference potential, the second voltage measurement input being connected to the transfer point via a second measuring line in the connecting cable,
c) the measuring circuit has a third voltage measurement input for measuring a third voltage in the electric meter,
d) the third voltage measurement input measures the third voltage in the electric meter between a high-side and the low-side thereof,
e) the first measuring line in the connecting cable detects the first voltage at the transfer point at the high-side,
f) the second measuring line in the connecting cable detects the second voltage at the transfer point at the low side,
g) the electric meter has a current measuring device for measuring the output current which flows to the load, and
h) the electric meter includes a calculation unit which is adapted to calculate the line losses in the connecting cable in the first operating mode as a function of:
h1) the measured value of the first voltage,
h2) the measured value of the second voltage,
h3) the measured value of the third voltage, and
h4) the measured value of the output current.

4. Electric meter according to claim 1, further comprising a second operating mode, in which the line losses in the connecting line are taken into account by a parameterized calculation of the line losses.

5. Electric meter according to claim 4, wherein
a) the electric meter has a parameter memory in which line parameters are stored which represent the line resistance of the connecting cable between the electric meter and the transfer point, the line parameters,
b) the calculation unit is adapted to calculate the line resistance in the connecting cable in the second operating mode as a function of the measured current and the stored line parameters, and/or c) the calculation unit is adapted to calculate the line losses in the connecting cable in the second operating mode in dependence on:
   c1) the measured output current and
   c2) the stored line parameters.

6. Electric meter according to claim 4, further comprising a third operating mode in which the line losses in the connecting cable to the load are not taken into account.

7. Electric meter according to claim 6, wherein
   a) the electric meter has a selection device for selecting one of the operating modes,
   b) the selection device is adapted to determine whether measuring lines are connected to the voltage measurement inputs of the electric meter and, if so, selects the first operating mode,
   c) the selection device is adapted to determine whether line parameters are stored in the parameter memory and is adapted to select the second operating mode if no measurement lines are connected to the voltage measurement inputs but line parameters are stored in the parameter memory, and
   d) the selection device is adapted to select the third operating mode if neither measuring lines are connected to the voltage measurement inputs nor line parameters are stored in the parameter memory.

8. Electric meter according to claim 7, wherein
   a) the selection device is adapted to compare the output voltage measured inside the electric meter at the current output with the output voltage measured directly at the transfer point, and
   b) the selection device is adapted to select the first operating mode with the four-wire measurement if the difference between the two output voltages is within a specified tolerance range.

9. Electric meter according to claim 8, wherein
   a) the selection device is adapted to check whether line parameters are stored in the parameter memory, and
   b) the selection device is adapted to select the second operating mode with the parameterized calculation of the line losses, if
      b1) the difference between the two output voltages is not within the specified tolerance range, and
      b2) line parameters are stored in the parameter memory.

10. Electric meter according to claim 8, wherein the selection device is adapted to select the third operating mode without taking into account the line losses if
   a) the difference between the two output voltages is not within the specified tolerance range, and
   b) no line parameters are stored in the parameter memory.

11. Electric meter system, comprising:
   a) the electric meter according to claim 1, and
   b) the connection cable that connects the electric meter to the load via a detachable plug
   c) wherein the connecting cable contains the two measuring lines which connect the two voltage measurement inputs of the electric meter to the transfer point in order to measure the output voltage directly at the transfer point.

12. Operating method for an electric meter, comprising:
   a) supplying a load with an electric current, which flows through the electric meter via a connecting cable to the load, the load having a certain current consumption and line losses occurring in the connecting cable,
   b) measurement of the current consumption of the load by the electric meter, and
   c) selection of one of several operating modes of the electric meter, whereby the operating modes differ by the consideration of the line losses, the several operating modes including a first operating mode of the electric meter, wherein the electric meter in the first operating mode takes into account the line losses in the connecting cable to the load by means of a four-wire measurement directly at the transfer point to the load, namely on the one hand by means of a voltage measurement at the transfer point and on the other hand by means of a current measurement in the electric meter, a second operating mode in which the line losses in the connecting line are taken into account by a parameterized calculation of the line losses, and a third operating mode in which the line losses in the connecting cable to the load are not taken into account.

13. Operating method according to claim 12, further comprising the following steps:
   a) measuring a first voltage directly at the transfer point with respect to a reference potential, the first voltage being tapped by a measuring line at the transfer point and measured at a first voltage measurement input of the electric meter,
   b) measuring a second voltage directly at the transfer point with respect to the reference potential, the second voltage being tapped via a measuring line directly at the transfer point and measured at a second voltage measurement input of the electric meter,
   c) measuring a third voltage in the electric meter between the two power connections of the electric meter,
   d) measuring the current flowing through the connecting cable to the load, and
   e) calculation of the line losses in the first operating mode as a function of:
      e1) the measured value of the first voltage,
      e2) the measured value of the second voltage,
      e3) the measured value of the third voltage, and
      e4) the measured value of the output current.

14. Operating method according to claim 13, further comprising the following steps for the parametric calculation of the line losses:
   a) storing line parameters in a parameter memory, wherein the line parameters represent the line resistance of the connecting cable between the electric meter and the transfer point to the load,
   b) reading out the line parameters from the parameter memory,
   c) measuring the current flowing from the electric meter through the connecting cable to the load, and
   d) calculating the line losses in the connection cable depending on the read out line parameters and the measured current.

15. Operating method according to claim 12, further comprising the following steps for selecting one of the operating modes:
   a) measuring a first output voltage of the electric meter before the connecting cable to the load,
   b) measuring a second output voltage directly at the transfer point to the load,
   c) comparing the two output voltages, and
   d) selection of the first operating mode if the difference between the two output voltages is within a specified tolerance range.

16. Operating method according to claim 14, further comprising the following steps for selecting one of the operating modes:
   a) checking whether line parameters are stored in the parameter memory, and b) selection of the second operating mode with the parameterized calculation of the line losses, if
  b1) the difference between the two output voltages is not within the specified tolerance range, and
  b2) are line parameters stored in the parameter memory.

17. Operating method according to claim 16, wherein the third operating mode is selected without consideration of line losses if
a) the difference between the two output voltages is not within the specified tolerance range, and
b) no line parameters are stored in the parameter memory.

\* \* \* \* \*